(12) United States Patent
Ishizawa et al.

(10) Patent No.: US 12,113,334 B2
(45) Date of Patent: Oct. 8, 2024

(54) LIGHT EMITTING DEVICE AND PROJECTOR

(71) Applicants: SEIKO EPSON CORPORATION, Tokyo (JP); SOPHIA SCHOOL CORPORATION, Tokyo (JP)

(72) Inventors: Shunsuke Ishizawa, Tokyo (JP); Katsumi Kishino, Tokyo (JP)

(73) Assignees: SEIKO EPSON CORPORATION, Tokyo (JP); SOPHIA SCHOOL CORPORATION, Tokyo (JP)

( * ) Notice: Subject to any disclaimer, the term of this patent is extended or adjusted under 35 U.S.C. 154(b) by 659 days.

(21) Appl. No.: 17/361,222

(22) Filed: Jun. 28, 2021

(65) Prior Publication Data

US 2021/0408765 A1    Dec. 30, 2021

(30) Foreign Application Priority Data

Jun. 30, 2020   (JP) .................................. 2020-112627

(51) Int. Cl.
*H01S 5/11*  (2021.01)
*G03B 21/20* (2006.01)

(52) U.S. Cl.
CPC ............ *H01S 5/11* (2021.01); *G03B 21/2033* (2013.01)

(58) Field of Classification Search
CPC ........ H01S 5/11; H01S 5/1021; H01S 5/1042; H01S 5/04257; H01S 5/1032;
(Continued)

(56) References Cited

U.S. PATENT DOCUMENTS 6,778,581 B1 *   8/2004   Lipson ................. G02B 6/1225
                                                              257/79
2006/0284187 A1   12/2006  Wierer, Jr. et al.
(Continued)

FOREIGN PATENT DOCUMENTS

JP    2007073945    3/2007
JP    2007234824    9/2007
(Continued)

*Primary Examiner* — Xinning (Tom) Niu
(74) *Attorney, Agent, or Firm* — JCIPRNET

(57) ABSTRACT

A light emitting device includes a substrate, and a stacked body provided to the substrate, and including a plurality of first columnar parts, wherein the stacked body includes a first semiconductor layer, a second semiconductor layer different in conductivity type from the first semiconductor layer, and a light emitting layer disposed between the first semiconductor layer and the second semiconductor layer, the first semiconductor layer and the light emitting layer constitute the first columnar parts, the first semiconductor layer is disposed between the substrate and the light emitting layer, the second semiconductor layer is provided with a plurality of recessed parts, the recessed part is provided with a low refractive-index part lower in refractive index than the second semiconductor layer, a plurality of the first columnar parts constitutes a first photonic crystal, the second semiconductor layer and the low refractive-index parts constitute a second photonic crystal, and the first photonic crystal and the second photonic crystal are optically coupled to each other.

7 Claims, 5 Drawing Sheets

(58) Field of Classification Search
CPC ........ H01S 5/185; H01S 5/32341; H01S 5/42; G03B 21/2033
See application file for complete search history.

(56) References Cited

U.S. PATENT DOCUMENTS

| | | | |
|---|---|---|---|
| 2007/0201526 A1* | 8/2007 | Hori .................... | H01S 5/18308 |
| | | | 372/98 |
| 2007/0201527 A1 | 8/2007 | Hori et al. | |
| 2008/0298419 A1 | 12/2008 | Hori et al. | |
| 2012/0327966 A1* | 12/2012 | Numata ................ | H01S 5/2009 |
| | | | 372/45.01 |
| 2015/0280062 A1* | 10/2015 | Yoo ........................ | H01L 33/52 |
| | | | 257/13 |
| 2020/0266611 A1* | 8/2020 | Nagawa ................ | H01S 5/3211 |
| 2020/0274330 A1* | 8/2020 | Nagawa ................ | H01S 5/2031 |

FOREIGN PATENT DOCUMENTS

| | | |
|---|---|---|
| JP | 2007234835 | 9/2007 |
| JP | 2013009002 | 1/2013 |
| JP | 2018133517 | 8/2018 |
| JP | 2019054127 | 4/2019 |
| JP | 2019083232 | 5/2019 |
| WO | 2010087231 | 8/2010 |

* cited by examiner

LIGHT EMITTING DEVICE AND PROJECTOR

The present application is based on, and claims priority from JP Application Serial Number 2020-112627, filed Jun. 30, 2020, the disclosure of which is hereby incorporated by reference herein in its entirety.

BACKGROUND

1. Technical Field

The present disclosure relates to a light emitting device and a projector.

2. Related Art

Laser diodes are promising as high-luminance next-generation light sources. In particular, the semiconductor laser having a nano-structure called a nano-column, a nano-wire, a nano-rod, a nano-pillar, or the like is expected to realize a light emitting device capable of obtaining light emission narrow in radiation angle and high in power due to an effect of a photonic crystal.

For example, in JP-A-2019-083232 (Document 1), there is disclosed a light emitting device which has columnar parts each including a first semiconductor layer, a second semiconductor layer different in conductivity type from the first semiconductor layer, and an active layer disposed between the first semiconductor layer and the second semiconductor layer, and in which a low-refractive index part lower in refractive index than the second semiconductor layer is disposed in a recessed part provided to the second semiconductor layer. In the light emitting device in Document 1, an average refractive index in an in-plane direction is lowered by providing the recessed part to the second semiconductor layer to thereby enhance an effect of confining light in the vicinity of a light emitting layer 34, and thus, the leakage of the light generated in the light emitting layer 34 to a second electrode 52 side is reduced. In such a light emitting device, it is possible to obtain the optical confinement effect by a photonic crystal constituted by a plurality of columnar parts.

In such a light emitting device as described above, in order to improve the element characteristics such as a threshold current density, it is required to increase a optical confinement factor.

SUMMARY

A light emitting device according to an aspect of the present disclosure includes a substrate, and a stacked body provided to the substrate, and including a plurality of first columnar parts, wherein the stacked body includes a first semiconductor layer, a second semiconductor layer different in conductivity type from the first semiconductor layer, and a light emitting layer disposed between the first semiconductor layer and the second semiconductor layer, the first semiconductor layer and the light emitting layer constitute the first columnar parts, the first semiconductor layer is disposed between the substrate and the light emitting layer, the second semiconductor layer is provided with a plurality of recessed parts, the recessed part is provided with a low refractive-index part lower in refractive index than the second semiconductor layer, a plurality of the first columnar parts constitutes a first photonic crystal, the second semiconductor layer and the low refractive-index parts constitute a second photonic crystal, and the first photonic crystal and the second photonic crystal are optically coupled to each other.

In the light emitting device according to the aspect, the optical distance between the first photonic crystal and the second photonic crystal may be no more than $3\lambda$ ($\lambda$ is an oscillation wavelength).

In the light emitting device according to the aspect, the first columnar parts and the low refractive-index parts may overlap in a plan view.

In the light emitting device according to the aspect, the first columnar parts and the low refractive-index parts may correspond one-to-one to each other.

In the light emitting device according to the aspect, a diametrical size of the recessed part may be smaller than a diametrical size of the first columnar part.

In the light emitting device according to the aspect, the second semiconductor layer may constitute a plurality of second columnar parts, and the first columnar parts and the second columnar parts may overlap in a plan view.

In the light emitting device according to the aspect, the second semiconductor layer may have a portion disposed so as to straddle a plurality of the first columnar parts.

A projector according to another aspect of the present disclosure includes the light emitting device described above.

DESCRIPTION OF EXEMPLARY EMBODIMENTS

Some preferred embodiments of the present disclosure will hereinafter be described in detail using the drawings. It should be noted that the embodiments described hereinafter do not unreasonably limit the contents of the present disclosure as set forth in the appended claims. Further, all of the constituents described hereinafter are not necessarily essential elements of the present disclosure.

1. First Embodiment

1.1. Light Emitting Device

Figure 1:
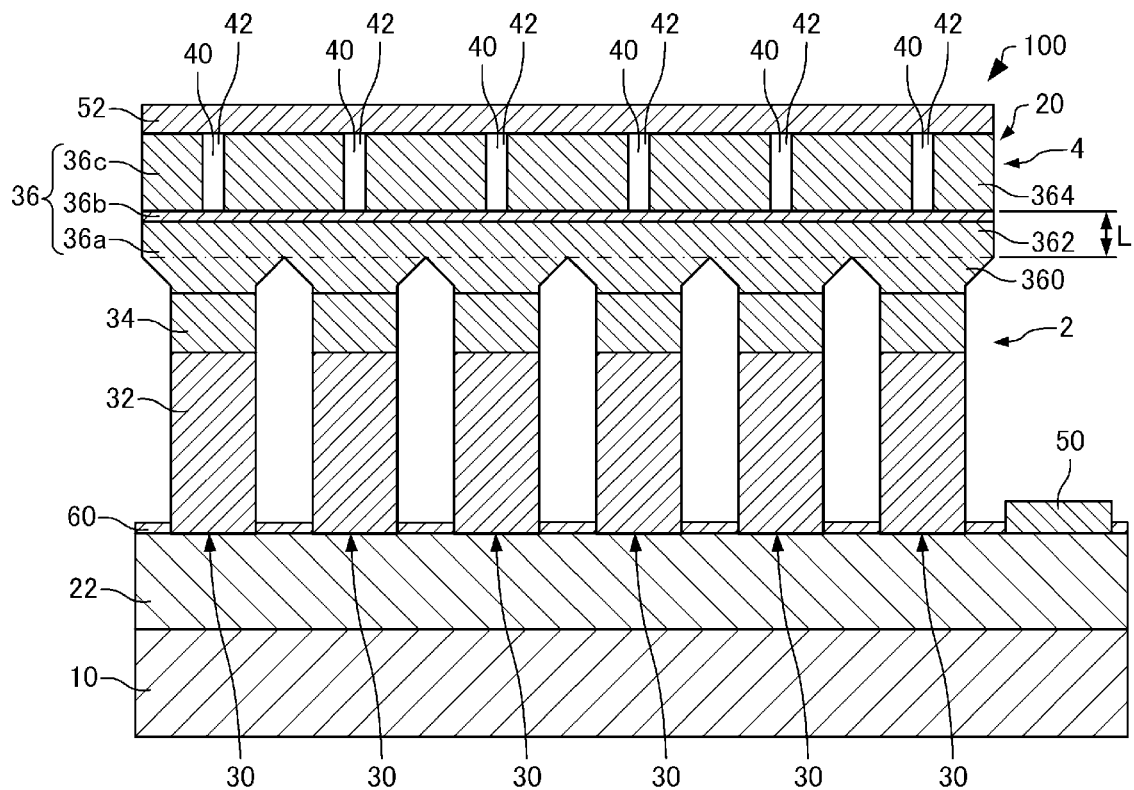
FIG. 1 is a cross-sectional view schematically showing a light emitting device according to a first embodiment.
Figure 2:
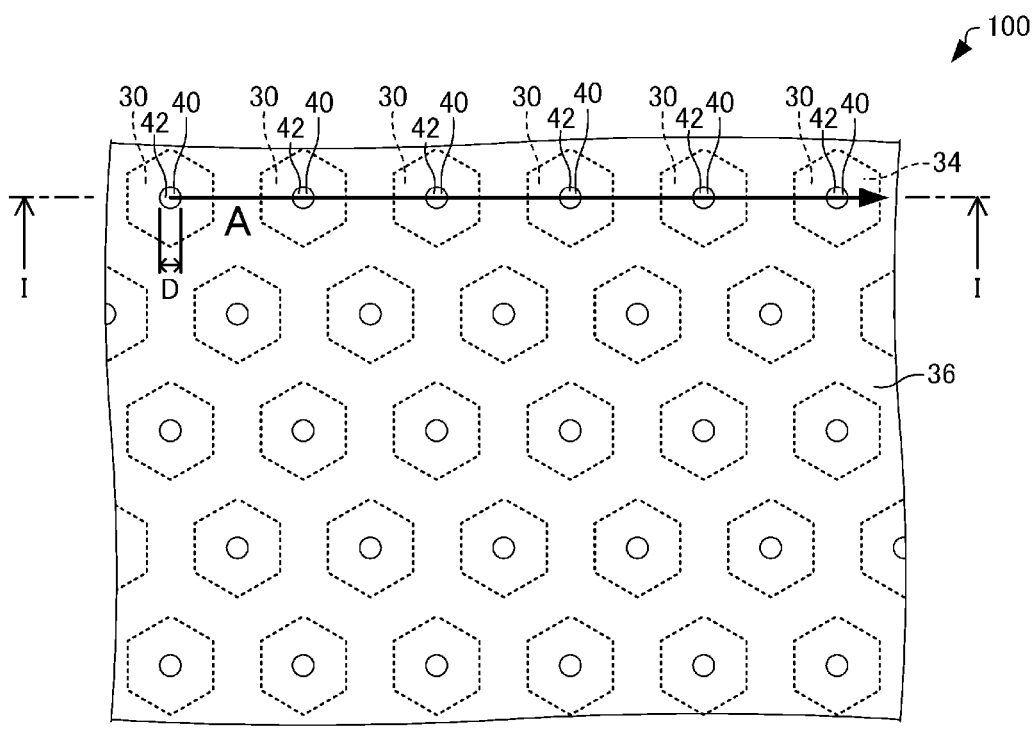
FIG. 2 is a plan view schematically showing the light emitting device according to the first embodiment.
Figure 3:
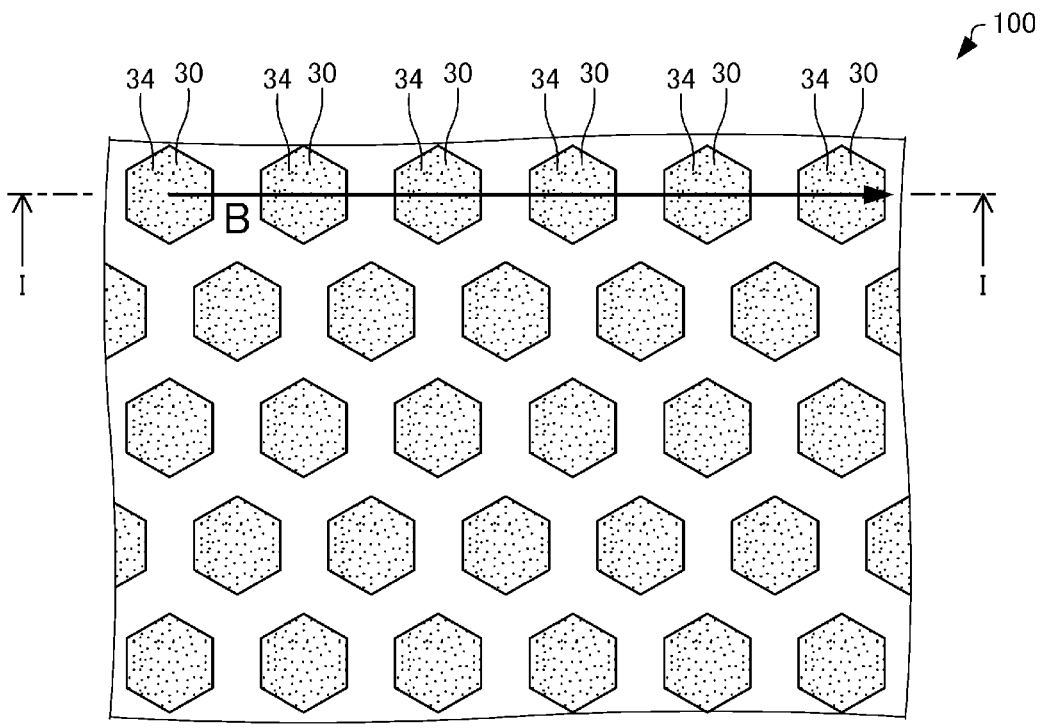
FIG. 3 is a plan view schematically showing the light emitting device according to the first embodiment.

Firstly, a light emitting device according to a first embodiment will be described with reference to the drawings. FIG. 1 is a cross-sectional view schematically showing the light emitting device 100 according to the first embodiment. FIG. 2 and FIG. 3 are each a plan view schematically showing the light emitting device 100 according to the first embodiment. It should be noted that in FIG. 2, the second semiconductor layer 36 and the columnar parts 30 are illustrated for the sake of convenience. In FIG. 3, there is illustrated a light emitting layer 34 constituting columnar parts 30 alone for the sake of convenience. Further, FIG. 1 is a cross-sectional view along the line I-I shown in FIG. 2 and FIG. 3.

As shown in FIG. 1, the light emitting device 100 has a substrate 10, a stacked body 20, a first electrode 50, and a second electrode 52.

The substrate 10 is, for example, an Si substrate, a GaN substrate, or a sapphire substrate.

The stacked body 20 is provided to the substrate 10. The stacked body 20 has a buffer layer 22, a first semiconductor layer 32, the light emitting layer 34, and a second semiconductor layer 36.

The buffer layer 22 is disposed on the substrate 10. The buffer layer 22 is, for example, an Si-doped n-type GaN layer. On the buffer layer 22, there is disposed a mask layer 60 for forming the columnar parts 30. The mask layer 60 is, for example, a titanium layer, a titanium oxide layer, a silicon oxide layer, or an aluminum oxide layer.

In the present specification, when taking the light emitting layer 34 as a reference in a stacking direction of the stacked body 20 (hereinafter also referred to simply as a "stacking direction"), the description will be presented assuming a direction from the light emitting layer 34 toward the second semiconductor layer 36 to be an "upward direction," and a direction from the light emitting layer 34 toward a first semiconductor layer 32 to be a "downward direction." Further, the "stacking direction of the stacked body" means a stacking direction of the first semiconductor layer 32 and the light emitting layer 34.

A part of each of the first semiconductor layer 32, the light emitting layer 34, and the second semiconductor layer 36 constitutes the columnar parts 30. The stacked body 20 has a plurality of the columnar parts 30. The columnar parts 30 are disposed on the buffer layer 22. The columnar parts 30 each have a columnar shape protruding upward from the buffer layer 22. The columnar part 30 is also referred to as, for example, a nano-column, a nano-wire, a nano-rod, or a nano-pillar. The planar shape of the columnar part 30 is, for example, a polygonal shape or a circle. In the example shown in FIG. 3, the planar shape of the columnar part 30 is a hexagonal shape.

The diametrical size of the columnar part 30 is, for example, no smaller than 50 nm and no larger than 500 nm. By setting the diametrical size of the columnar part 30 to be no larger than 500 nm, it is possible to obtain the light emitting layer 34 made of crystals high in quality, and at the same time, it is possible to reduce the distortion inherent in the light emitting layer 34. Thus, it is possible to amplify the light generated in the light emitting layer 34 with high efficiency. The columnar parts 30 are, for example, equal in diametrical size to each other.

It should be noted that when the planar shape of the columnar part 30 is a circle, the "diametrical size of the columnar part" means the diameter of the circle, and when the planar shape of the columnar part 30 is not a circular shape, the "diametrical size of the columnar part" means the diameter of the minimum bounding circle. For example, when the planar shape of the columnar part 30 is a polygonal shape, the diametrical size of the columnar part 30 is the diameter of a minimum circle including the polygonal shape inside, and when the planar shape of the columnar part 30 is an ellipse, the diametrical size of the columnar part 30 is the diameter of a minimum circle including the ellipse inside.

The number of the columnar parts 30 disposed is two or more. An interval between the columnar parts 30 adjacent to each other is, for example, no smaller than 1 nm and no larger than 500 nm. The columnar parts 30 are arranged at a predetermined pitch in a predetermined direction in a plan view viewed from the stacking direction (hereinafter also referred to simply as "in the plan view"). The plurality of columnar parts 30 is arranged so as to form a triangular lattice. It should be noted that the arrangement of the plurality of columnar parts 30 is not particularly limited, but the plurality of columnar parts 30 can be arranged to form a square lattice.

It should be noted that the "pitch of the columnar parts" means a distance between the centers of the columnar parts 30 adjacent to each other along the predetermined direction. When the planar shape of the columnar part 30 is a circle, the "center of the columnar part" means the center of the circle, and when the planar shape of the columnar part 30 is not a circular shape, the "center of the columnar part" means the center of the minimum bounding circle. For example, when the planar shape of the columnar part 30 is a polygonal shape, the center of the columnar part 30 is the center of a minimum circle including the polygonal shape inside, and when the planar shape of the columnar part 30 is an ellipse, the center of the columnar part 30 is the center of a minimum circle including the ellipse inside.

The plurality of columnar parts 30 constitutes a first photonic crystal 2. The first photonic crystal 2 is a structure periodically varying in refractive index due to the plurality of columnar parts 30 arranged regularly.

The columnar parts 30 each have a part of each of the first semiconductor layer 32, the light emitting layer 34, and the second semiconductor layer 36.

The first semiconductor layer 32 is disposed on the buffer layer 22. The first semiconductor layer 32 is disposed between the substrate 10 and the light emitting layer 34. The first semiconductor layer 32 is an n-type semiconductor layer. The first semiconductor layer 32 is, for example, a Si-doped n-type GaN layer.

The light emitting layer 34 is disposed on the first semiconductor layer 32. The light emitting layer 34 is disposed between the first semiconductor layer 32 and the second semiconductor layers 36. The light emitting layer 34 generates light in response to injection of an electrical current. The light emitting layer 34 has a multiple quantum well structure obtained by stacking quantum well structures each constituted by, for example, an i-type GaN layer doped with no impurity and an i-type InGaN layer.

The second semiconductor layer 36 is disposed on the light emitting layer 34. The second semiconductor layer 36 is a layer different in conductivity type from the first semiconductor layer 32. The second semiconductor layer 36 is a p-type semiconductor layer. The first semiconductor layer 32 and the second semiconductor layer 36 are cladding layers having a function of confining the light in the light emitting layer 34.

The second semiconductor layer 36 has a first GaN layer 36a, an AlGaN layer 36b, and a second GaN layer 36c. The first GaN layer 36a, the AlGaN layer 36b, and the second GaN layer 36c are stacked in this order from the light emitting layer 34 side.

The first GaN layer 36a is located between the light emitting layer 34 and the AlGaN layer 36b. Apart of the first GaN layer 36a constitutes the columnar part 30. The first GaN layer 36a is, for example, an Mg-doped p-type GaN layer.

The AlGaN layer 36b is located between the first GaN layer 36a and the second GaN layer 36c. The AlGaN layer 36b functions as an electron block layer. Further, as described later, the AlGaN layer 36b also functions as a etch stop layer for forming recessed parts 40. The AlGaN layer 36b is, for example, an Mg-doped p-type AlGaN layer.

The second GaN layer 36c is located between the AlGaN layer 36b and the second electrode 52. The second GaN layer 36c is, for example, an Mg-doped p-type GaN layer.

The second semiconductor layer 36 is provided with the plurality of recessed parts 40. The recessed parts 40 are disposed in the second GaN layer 36c. The recessed part 40 has an opening on an upper surface of the second semiconductor layer 36. The upper surface of the second semiconductor layer 36 is a surface on an opposite side to the substrate 10 side of the second semiconductor layer 36. In the illustrated example, the upper surface of the second semiconductor layer 36 has contact with the second electrode 52.

As shown in FIG. 1 and FIG. 2, the recessed parts 40 and the columnar parts 30 are disposed so as to correspond one-to-one to each other. In other words, one recessed part 40 is disposed so as to correspond to one columnar part 30. The columnar parts 30 are arranged at a predetermined pitch in the predetermined direction, and the recessed parts 40 are also arranged at the predetermined pitch in the predetermined direction similarly to the columnar parts 30. Further, in the illustrated example, the columnar parts 30 are arranged in the triangular lattice, and the recessed parts 40 are also arranged in the triangular lattice.

In a plan view, the recessed parts 40 and the columnar parts 30 overlap each other, respectively. In the example shown in FIG. 2, the center of each of the recessed parts 40 overlaps corresponding one of the columnar parts 30. Specifically, the center of each of the recessed parts 40 is located inside the outer edge of corresponding one of the columnar parts 30 in the plan view. In the example shown in FIG. 2, the center of each of the recessed parts 40 overlaps the center of corresponding one of the columnar parts 30. In other words, the position of the center of each of the recessed parts 40 coincides with the position of the center of corresponding one of the columnar parts 30 in the plan view.

It should be noted that when the planar shape of the recessed part 40 is a circle, the "center of the recessed part" means the center of the circle, and when the planar shape of the recessed part 40 is not a circular shape, the "center of the recessed part" means the center of the minimum bounding circle. For example, when the planar shape of the recessed part 40 is a polygonal shape, the center of the recessed part 40 is the center of a minimum circle including the polygonal shape inside, and when the planar shape of the recessed part 40 is an ellipse, the center of the recessed part 40 is the center of a minimum circle including the ellipse inside.

The depth of the recessed part 40, namely the size in the stacking direction of the recessed part 40 is smaller than the thickness of the second semiconductor layer 36. Therefore, the upper surface of the light emitting layer 34 is covered with the second semiconductor layer 36, and is not exposed by the recessed parts 40. The depth of the recessed part 40 is, for example, equal to the thickness of the second GaN layer 36c of the second semiconductor layer 36.

The planar shape of the recessed part 40 is a circle as shown in FIG. 2. In other words, the shape of an opening of the recessed part 40 is a circle. It should be noted that the planar shape of the recessed part 40 is not particularly limited, and can also be a polygonal shape, an ellipse, or the like.

The diametrical size D of the recessed part 40 is smaller than the diametrical size of the columnar part 30. The diametrical size D of the recessed part 40 is, for example, smaller than, for example, the diametrical size of an upper end of the columnar part 30. The upper end of the columnar part 30 is a portion having contact with a second portion 362 of the second semiconductor layer 36.

When the planar shape of the recessed part 40 is a circle, the "diametrical size of the recessed part" means the diameter of the circle, and when the planar shape of the recessed part 40 is not a circular shape, the "diametrical size of the recessed part" means the diameter of the minimum bounding circle. For example, when the planar shape of the recessed part 40 is a polygonal shape, the diametrical size of the recessed part 40 is the diameter of a minimum circle including the polygonal shape inside, and when the planar shape of the recessed part 40 is an ellipse, the diametrical size of the recessed part 40 is the diameter of a minimum circle including the ellipse inside.

The recessed part 40 is provided with a low refractive-index part 42 lower in refractive index than the second semiconductor layer 36. The low refractive-index part 42 is, for example, an air gap, namely formed of air. It should be noted that the low refractive-index part 42 is not limited to an air gap, and it is sufficient for the low-refractive index part 42 to be formed of a material made of a low-refractive index material lower in refractive index than the second semiconductor layer 36. The material of the low refractive-index part 42 is, for example, AlGaN, AlN, InAlN, silicon oxide, silicon nitride, or polyimide.

An average refractive index in an in-plane direction of portions of the second semiconductor layer 36 where the low refractive-index parts 42 are respectively disposed is lower than an average refractive index in an in-plane direction of portions of the second semiconductor layer 36 where the low refractive-index parts 42 are not disposed. Since the low refractive-index parts 42 are disposed in the vicinity of the second electrode 52 of the second semiconductor layer 36, it is possible to lower the average refractive index in the in-plane direction in the vicinity of the second electrode 52 of the second semiconductor layer 36. The in-plane direction is a direction perpendicular to the stacking direction.

As described above, since the recessed parts 40 and the columnar parts 30 are disposed one-to-one, the low refractive-index parts 42 and the columnar parts 30 are disposed one-to-one. Further, in the plan view, since the recessed parts 40 and the columnar parts 30 respectively overlap each other, the low refractive-index parts 42 and the columnar parts 30 respectively overlap each other. The low refractive-index parts 42 are in a lattice arrangement of the same type as that of the columnar parts 30, and are arranged at the same period, namely with the same lattice constant, as that of the columnar parts 30 at the same time. In the illustrated example, the columnar parts 30 and the low refractive-index parts 42 are both arranged in the triangular lattice.

The second semiconductor layer 36 and the plurality of low refractive-index parts 42 constitute a second photonic crystal 4. The second photonic crystal 4 is a structure periodically varying in refractive index due to the plurality of low refractive-index parts 42 arranged regularly.

As shown in FIG. 1, the second semiconductor layer 36 has a first portion 360, a second portion 362, and a third portion 364.

The first portion 360 is a portion constituting the columnar parts 30 in the second semiconductor layer 36. In other words, the first portion 360 constitutes the first photonic crystal 2. The first portion 360 is formed of a part of the first GaN layer 36a.

The second portion 362 is a portion of the second semiconductor layer 36 which is disposed so as to straddle the plurality of columnar parts 30, and is a portion which does not constitute the second photonic crystal 4. The second portion 362 is located between the first portion 360 constituting the columnar parts 30, and the third portion 364 in which the recessed parts 40 are disposed. In other words, the second portion 362 is located between the first photonic crystal 2 and the second photonic crystal 4. A distance L between the first photonic crystal 2 and the second photonic crystal 4 is equal to the film thickness of the second portion 362. The film thickness of the second portion 362 is, for example, no smaller than several tens of nanometers and no larger than several hundreds of nanometers. The second portion 362 is constituted by a part of the first GaN layer 36a and the AlGaN layer 36b.

The third portion 364 is a portion of the second semiconductor layer 36 which is disposed so as to straddle the plurality of columnar parts 30, and is a portion where the recessed parts 40 are disposed. In other words, the third portion 364 constitutes the second photonic crystal 4. The third portion 364 is formed of the second GaN layer 36c.

In the light emitting device 100, the first photonic crystal 2 and the second photonic crystal 4 are optically coupled to each other. The state in which the first photonic crystal 2 and the second photonic crystal 4 are optically coupled to each other is the state in which the first photonic crystal 2 and the second photonic crystal 4 are affected from each other, and means the state in which a signal photonic crystal effect is developed by the first photonic crystal 2 and the second photonic crystal 4. When the first photonic crystal 2 and the second photonic crystal 4 are optically coupled to each other, a waveguide mode in the first photonic crystal 2 and a waveguide mode in the second photonic crystal 4 are combined with each other. In other words, in the first photonic crystal 2 and the second photonic crystal 4, there can be obtained a laser oscillation in the same oscillation mode. In the light emitting device 100, the first photonic crystal 2 and the second photonic crystal 4 are optically coupled to each other to form an optical confinement mode.

In the light emitting device 100, the first photonic crystal 2 and the second photonic crystal 4 have the lattice arrangement of the same type, and are arranged at the same period. Further, the first photonic crystal 2 and the second photonic crystal 4 are the same in the in-plane arrangement orientation as each other. Therefore, in the light emitting device 100, it is possible to optically couple the first photonic crystal 2 and the second photonic crystal 4 to obtain an intense optical confinement effect.

In the illustrated example, the plurality of columnar parts 30 constituting the first photonic crystal 2, and the plurality of low refractive-index parts 42 constituting the second photonic crystal 4 have the lattice arrangement of the same type, and are at the same time arranged at the same period, namely with the same lattice constant.

Further, an in-plane arrangement orientation A of the plurality of columnar parts 30 constituting the first photonic crystal 2 and an in-plane arrangement orientation B of the plurality of low refractive-index parts 42 constituting the second photonic crystal 4 coincide with each other. The in-plane arrangement orientation A of the plurality of columnar parts 30 is a direction in which the columnar parts 30 are arranged in a plan view. The in-plane arrangement orientation B of the plurality of low refractive-index parts 42 is a direction in which the low refractive-index parts 42 are arranged in the plan view. When the arrangement orientation A and the arrangement orientation B coincide with each other means the state in which a direction of a predetermined row of the columnar parts 30 and a direction of a row of the low refractive-index parts 42 corresponding to the predetermined row coincide with each other, namely the state in which no rotational shift exists between the row of the columnar parts 30 and the row of the low refractive-index parts corresponding thereto.

As described above, in the light emitting device 100, since the plurality of columnar parts 30 and the plurality of low refractive-index parts 42 have the lattice arrangement of the same type, and have the same period, and coincide in in-plane arrangement orientation with each other, the first photonic crystal 2 and the second photonic crystal 4 have the lattice arrangement of the same type, and have the same period, and coincide in in-plane arrangement orientation with each other.

Further, in the light emitting device 100, the first photonic crystal 2 and the second photonic crystal 4 are constant in the relative positional relationship between the both photonic crystals in the plane. Therefore, it is possible for the first photonic crystal 2 and the second photonic crystal 4 to optically be coupled to develop the single photonic crystal effect. For example, when the relative positional relationship between the photonic crystals is not constant, and the position shift occurs, a photonic band varies due to the position shift, and thus, there occurs a failure in obtaining an ideal optical confinement effect such as a failure in obtaining laser oscillation in a single mode.

It should be noted that the configuration of the first photonic crystal 2 and the second photonic crystal 4 is not limited to the example described above providing it is possible to optically couple the first photonic crystal 2 and the second photonic crystal 4 to each other to obtain the optical confinement effect.

The optical distance between the first photonic crystal 2 and the second photonic crystal 4 is no more than 3λ. It should be noted that the reference symbol λ denotes an lasing wavelength. Further, the optical distance is a so-called optical path length, and is obtained by multiplying a propagation distance of the light by the refractive index. By disposing the first photonic crystal 2 and the second photonic crystal 4 at a distance no more than 3λ, it is possible to optically couple the first photonic crystal 2 and the second photonic crystal 4 with tightness.

In the example shown in FIG. 1, the optical distance between the first photonic crystal 2 and the second photonic crystal 4 can be obtained from the film thickness of the first GaN layer 36a, the film thickness of the AlGaN layer 36b, the refractive index of the first GaN layer 36a, and the refractive index of the AlGaN layer 36b.

Between the columnar parts 30 adjacent to each other, there is, for example, an air gap. It should be noted that it is also possible to dispose a light propagation layer between the columnar parts 30 adjacent to each other. The light propagation layer is, for example, a silicon oxide layer, an aluminum oxide layer, or a titanium oxide layer. It is possible for the light generated in the light emitting layer 34 to pass through the air gap or the light propagation layer to propagate through the plurality of columnar parts 30 in a direction perpendicular to the stacking direction.

The first electrode 50 is disposed on the buffer layer 22. It is also possible for the buffer layer 22 to have ohmic contact with the first electrode 50. The first electrode 50 is electrically coupled to the first semiconductor layer 32. In the illustrated example, the first electrode 50 is electrically coupled to the first semiconductor layer 32 via the buffer layer 22. The first electrode 50 is one of the electrodes for injecting the electrical current into the light emitting layer 34. As the first electrode 50, there is used, for example, what is obtained by stacking a Cr layer, an Ni layer, and an Au layer in this order from the buffer layer 22 side.

The second electrode 52 is disposed at an opposite side to the substrate 10 side of the stacked body 20. In the illustrated example, the second electrode 52 is disposed on the second semiconductor layer 36 and the recessed parts 40. The second electrode 52 is not provided to the recessed part 40. The second electrode 52 is not disposed on the surface of the second semiconductor layer 36 defining the recessed part 40.

The second electrode 52 is electrically coupled to the second semiconductor layer 36. The second electrode 52 is the other of the electrodes for injecting the electrical current into the light emitting layer 34. As the second electrode 52, there is used, for example, ITO (indium tin oxide). The film thickness of the second electrode 52 is, for example, no smaller than 100 nm and no larger than 300 nm.

In the light emitting device 100, a pin diode is constituted by the second semiconductor layer 36 of the p-type, the light emitting layer 34, and the first semiconductor layer 32 of the n-type. In the light emitting device 100, when applying a forward bias voltage of the pin diode between the first electrode 50 and the second electrode 52, the electrical current is injected into the light emitting layer 34, and recombination of electrons and holes occurs in the light emitting layer 34. The recombination causes light emission. The light generated in the light emitting layer 34 propagates in an in-plane direction due to the first semiconductor layer 32 and the second semiconductor layer 36 to form a standing wave due to the effect of the first photonic crystal 2 and the second photonic crystal 4 optically coupled to each other, and is then gained by the light emitting layer 34 to cause the lasing. Then, the light emitting device 100 emits positive first-order diffracted light and negative first-order diffracted light as a laser beam in the stacking direction.

In the light emitting device 100, by providing the low refractive-index parts 42 to the second semiconductor layer 36, it is possible to lower the average refractive index in the in-plane direction in the vicinity of the second electrode 52 of the second semiconductor layer 36. Therefore, in the light emitting device 100, it is possible to enhance the effect of confining the light in the vicinity of the light emitting layer 34, and it is possible to reduce the leakage of the light generated in the light emitting layer 34 toward the second electrode 52. Therefore, in the light emitting device 100, it is possible to reduce the absorption of the light by the second electrode 52, and thus, it is possible to reduce the loss of the light due to the second electrode 52.

It should be noted that although the light emitting layer 34 of the InGaN-based material is described above, as the light emitting layer 34, there can be used a variety of types of material system capable of emitting light in response to injection of an electrical current in accordance with the wavelength of the light to be emitted. It is possible to use semiconductor material systems of, for example, an AlGaN, an AlGaAs, an InGaAs, an InGaAsP, an InP, a GaP, or an AlGaP.

The light emitting device 100 can exert, for example, the following functions and advantages.

In the light emitting device 100, the plurality of columnar parts 30 constitutes the first photonic crystal 2, the second semiconductor layer 36 and the low refractive-index parts 42 constitute the second photonic crystal 4, and the first photonic crystal 2 and the second photonic crystal 4 are optically coupled to each other. Therefore, in the light emitting device 100, it is possible to optically couple the first photonic crystal 2 and the second photonic crystal 4 to obtain the optical confinement effect. Therefore, in the light emitting device 100, it is possible to improve the optical confinement factor.

In the light emitting device 100, by providing the low refractive-index parts 42 to the second semiconductor layer 36, it is possible to lower the average refractive index in the in-plane direction in the vicinity of the second electrode 52 of the second semiconductor layer 36. Therefore, in the light emitting device 100, it is possible to enhance the effect of confining the light in the vicinity of the light emitting layer 34, and it is possible to reduce the leakage of the light generated in the light emitting layer 34 toward the second electrode 52. Here, in the light emitting device 100, the second photonic crystal 4 is constituted by the second semiconductor layer 36 and the low refractive-index parts 42. Therefore, compared to when the second semiconductor layer 36 and the low refractive-index parts 42 do not constitute the photonic crystal, it is possible to reduce the scattering loss of the light in the second semiconductor layer 36.

For example, when the second semiconductor layer 36 is provided with the low refractive-index parts 42, and these do not constitute the photonic crystal, a refractive index difference occurs in a boundary between the second semiconductor layer 36 and the low refractive-index parts 42. In contrast, in the light emitting device 100, since the second semiconductor layer 36 and the low refractive-index parts 42 constitute the photonic crystal, it is possible to reduce the scattering of the light in the boundary between the second semiconductor layer 36 and the low refractive-index parts 42.

In the light emitting device 100, the optical distance between the first photonic crystal 2 and the second photonic crystal 4 is no more than $3\lambda$. Therefore, in the light emitting device 100, it is possible to optically couple the first photonic crystal 2 and the second photonic crystal 4 to each other with tightness.

In the light emitting device 100, the columnar parts 30 and the low refractive-index parts 42 overlap each other respectively in the plan view. Therefore, in the light emitting device 100, it is possible to enhance the effect of confining the light in the light emitting layer 34 compared to when the columnar parts 30 and the low refractive-index parts 42 do not overlap each other. Further, in the light emitting device 100, the diametrical size D of the recessed part 40 is smaller than the diametrical size of the columnar part 30. Therefore, in the light emitting device 100, it is possible to efficiently inject the electrical current into the light emitting layer 34 while increasing the effect of confining the light in the light emitting layer 34.

For example, when the columnar parts 30 and the low refractive-index 42 overlap each other in the plan view, since the electrical current to be injected from the second electrode 52 into the light emitting layer 34 takes a path bypassing the recessed parts 40, there is a possibility that the electrical resistance increases. In particular, when the diametrical size D of the recessed part 40 is larger than the diametrical size of the columnar part 30, it is necessary for the current to take the significantly bypassing path, and thus, the electrical resistance increases, and it is not achievable to efficiently inject the electrical current into the light emitting layer 34. In contrast, in the light emitting device 100, since the diametrical size D of the recessed part 40 is smaller than the diametrical size of the columnar part 30, it is possible to shorten the path of the electrical current compared to when the diametrical size D of the recessed part 40 is larger than the diametrical size of the columnar part 30, and thus, it is possible to efficiently inject the electrical current into the light emitting layer 34.

Further, in the light emitting device 100, the diametrical size D of the recessed part 40 is smaller than the diametrical size of the upper end of the columnar part 30. Thus, it is possible to shorten the path of the electrical current to be injected from the second electrode 52 into the light emitting layer 34, and thus, it is possible to effectively inject the electrical current into the light emitting layer 34.

1.2. Method of Manufacturing Light Emitting Device

Figure 4:
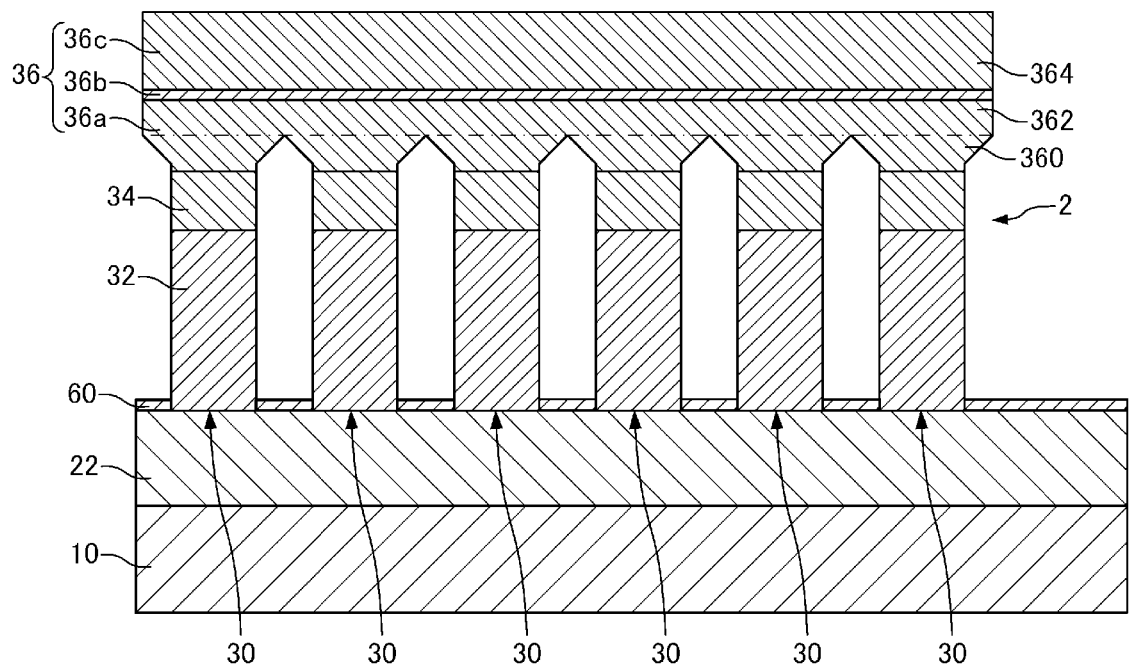
FIG. 4 is a cross-sectional view schematically showing a manufacturing process of the light emitting device according to the first embodiment.
Figure 5:
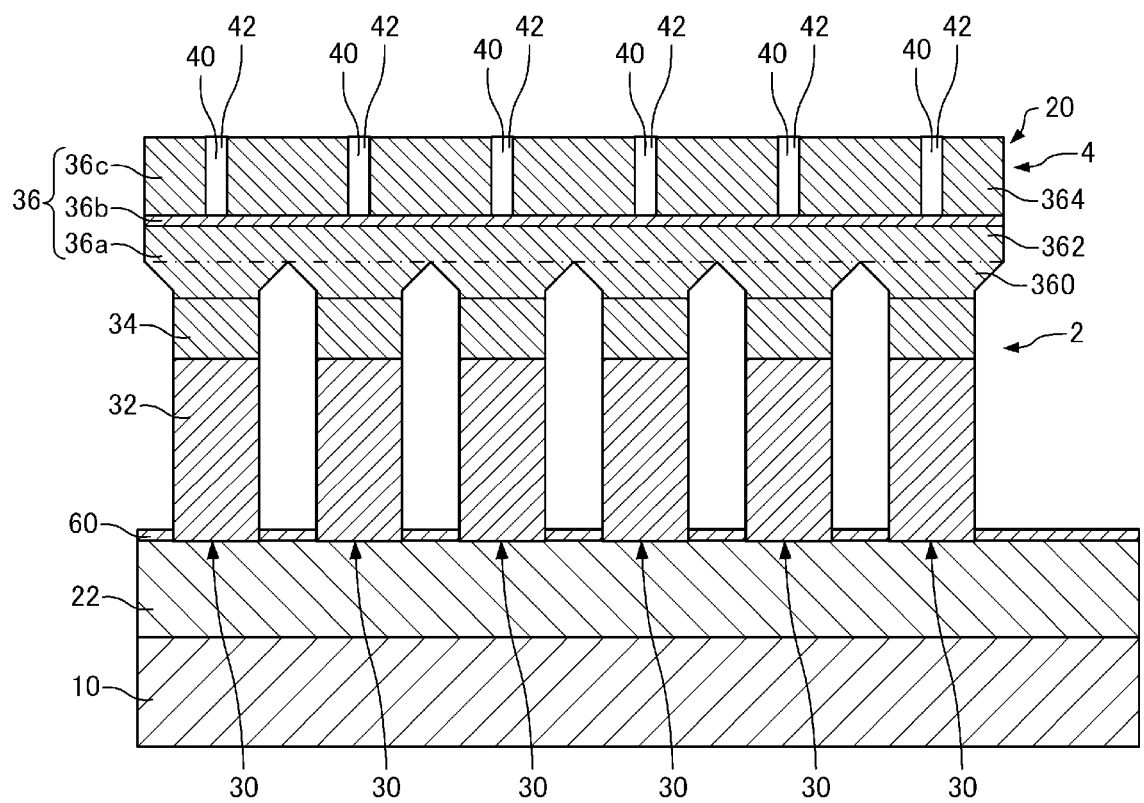
FIG. 5 is a cross-sectional view schematically showing a manufacturing process of the light emitting device according to the first embodiment.

Then, a method of manufacturing the light emitting device 100 according to the first embodiment will be described with reference to the drawings. FIG. 4 and FIG. 5 are cross-sectional views schematically showing a manufacturing process of the light emitting device 100 according to the first embodiment.

As shown in FIG. 4, the buffer layer 22 is grown epitaxially on the substrate 10. As the method of achieving the epitaxial growth, there can be cited, for example, an MOCVD (Metal Organic Chemical Vapor Deposition) method and an MBE (Molecular Beam Epitaxy) method.

Then, a mask layer 60 is formed on the buffer layer 22, and then the first semiconductor layer 32, the light emitting layer 34, and the second semiconductor layer 36 are grown epitaxially on the buffer layer 22 using the mask layer 60 as a mask. As the method of achieving the epitaxial growth, there can be cited, for example, the MOCVD method and the MBE method. Thus, the plurality of columnar parts 30 is formed.

Here, when epitaxially growing the second semiconductor layer 36, the first GaN layer 36a, the AlGaN layer 36b, and the second GaN layer 36c are grown epitaxially in this order. Further, when epitaxially growing the second semiconductor layer 36, the epitaxial growth is performed on the condition that the second semiconductor layer 36 grows not only in the stacking direction but also in the in-plane direction. For example, when performing the epitaxial growth, by controlling the supply of the gas, growth temperature, and so on, it is possible to grow the second semiconductor layer 36 in the in-plane direction. Thus, the distance between the columnar parts 30 adjacent to each other becomes shorter as the second semiconductor layer 36 grows, and then the columnar parts 30 adjacent to each other are finally coupled to each other. As a result, it is possible to form the second semiconductor layer 36 having the first portion 360 constituting the columnar parts 30, and the second portion 362 and the third portion 364 disposed so as to straddle the plurality of columnar parts 30.

As shown in FIG. 5, the plurality of recessed parts 40 is provided to the second semiconductor layer 36. The recessed parts 40 can be formed by, for example, patterning the second semiconductor layer 36. The patterning of the second semiconductor layer 36 can be performed by photolithography or electron beam lithography, and etching. When patterning the recessed parts 40, by referring to a marker used when forming the mask layer 60, it is possible to surely make the positions of the recessed parts 40 and the positions of the columnar parts 30 coincide with each other respectively.

Further, the etching rate of AlGaN is lower than the etching rate of GaN. Therefore, by etching the second GaN layer 36c using the AlGaN layer 36b as an etch stop layer, it is possible to easily form the recessed parts 40. As a result, it is possible to form the recessed parts 40 in the second GaN layer 36c, manly the third portion 364 of the second semiconductor layer 36.

As shown in FIG. 1, the first electrode 50 is formed on the buffer layer 22, and the second electrode 52 is formed on the second semiconductor layer 36. The first electrode 50 and the second electrode 52 are formed using, for example, a vacuum deposition method. When forming the second electrode 52 using the vacuum deposition method, the deposition is performed from an oblique direction with respect to the stacking direction. Thus, it is possible to prevent the electrode material from entering the recessed parts 40.

Due to the process described hereinabove, it is possible to manufacture the light emitting device 100.

1.3. Modified Example

Figure 6:
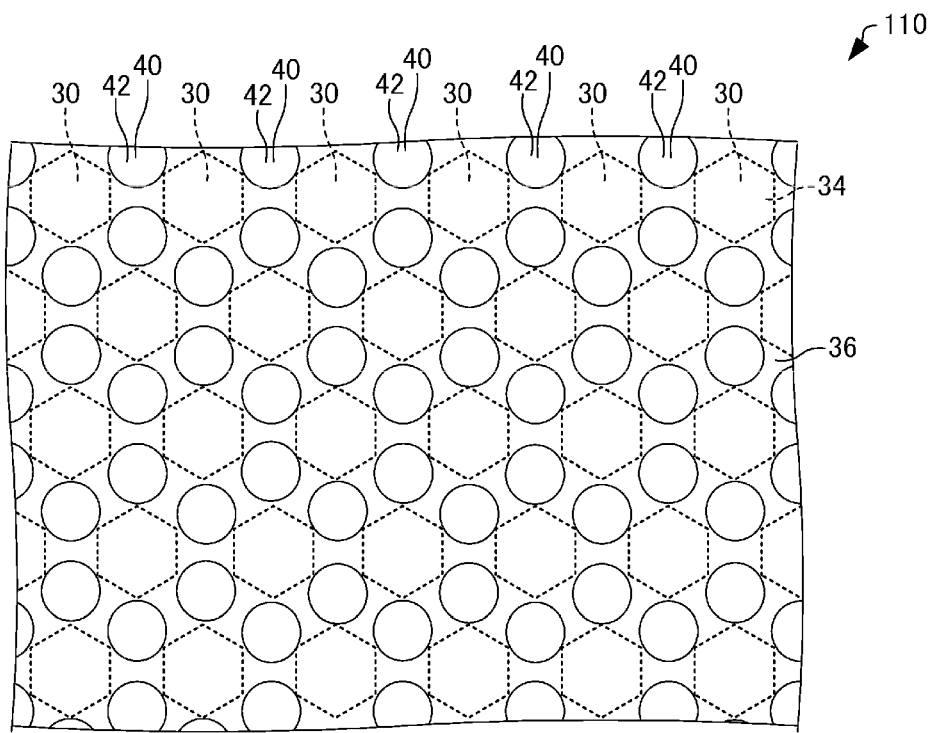
FIG. 6 is a plan view schematically showing the light emitting device according to a modified example of the first embodiment.

Then, a light emitting device according to a modified example of the first embodiment will be described with reference to the drawings. FIG. 6 is a plan view schematically showing the light emitting device 110 according to the modified example of the first embodiment. Hereinafter, in the light emitting device 110 according to the modified example of the first embodiment, the members having substantially the same functions as those of the constituent members of the light emitting device 100 according to the first embodiment described above will be denoted by the same reference symbols, and detailed descriptions thereof will be omitted.

In the light emitting device 100 described above, the first photonic crystal 2 and the second photonic crystal 4 are arranged in the lattice arrangement of the same type, and the plurality of columnar parts 30 and the plurality of low refractive-index parts 42 are both arranged in the triangular lattice as shown in FIG. 2 and FIG. 3.

In contrast, in the light emitting device 110, the first photonic crystal 2 and the second photonic crystal 4 are arranged in the lattice arrangement of the same type, but the lattice arrangement of the plurality of columnar parts 30 and the lattice arrangement of the plurality of low refractive-index parts 42 are different from each other as shown in FIG. 6.

In the example shown in FIG. 6, the plurality of columnar parts 30 is arranged in the triangular lattice. Further, the planar shape of the columnar part 30 is a regular hexagon. The six low refractive-index parts 42 are disposed with respect to each of the columnar parts 30 so as to correspond to the respective vertexes of the regular hexagon formed by the columnar part 30. When the low refractive-index parts 42 are disposed at the same position in the columnar parts 30 adjacent to each other, it is possible to use the low refractive-index part 42 in common. As described above, by disposing the low refractive-index parts 42 at the respective vertexes of the columnar parts 30, it is possible to make the first photonic crystal 2 and the second photonic crystal 4 have the lattice arrangement of the same type.

It should be noted that the arrangement of the columnar parts 30 and the recessed parts 40 is not limited to the example described above providing the first photonic crystal 2 and the second photonic crystal 4 have the lattice arrangement of the same type, and have the same period, and coincide in in-plane arrangement orientation with each other.

The light emitting layer 34 constituting the columnar parts 30 and the recessed parts 40 overlap each other in the plan view in the light emitting device 100 as shown in FIG. 2, but in the light emitting device 110, the light emitting layer 34 constituting the columnar parts 30 and the recessed parts 40 do not overlap each other in the plan view as shown in FIG. 6. Therefore, in the light emitting device 110, it is possible to efficiently inject the electrical current to the light emitting layer 34 compared to when, for example, the light emitting layer 34 constituting the columnar parts 30 and the recessed parts 40 overlap each other in the plan view.

For example, when the light emitting layer 34 constituting the columnar parts 30 and the recessed parts 40 overlap each other, since the electrical current to be injected from the second electrode 52 into the light emitting layer 34 takes a path bypassing the recessed parts 40, there is a possibility that the electrical resistance increases. In contrast, in the light emitting device 110, since the light emitting layer 34 constituting the columnar parts 30 and the recessed parts 40 do not overlap each other, it is possible to shorten the path of the electrical current, and it is possible to efficiently inject the electrical current into the light emitting layer 34.

In the light emitting device 110, it is possible to optically couple the first photonic crystal 2 and the second photonic crystal 4 to each other to obtain the intense optical confinement effect similarly to the light emitting device 100. Therefore, in the light emitting device 110, it is possible to improve the optical confinement factor.

2. Second Embodiment

2.1. Light Emitting Device

Figure 7:
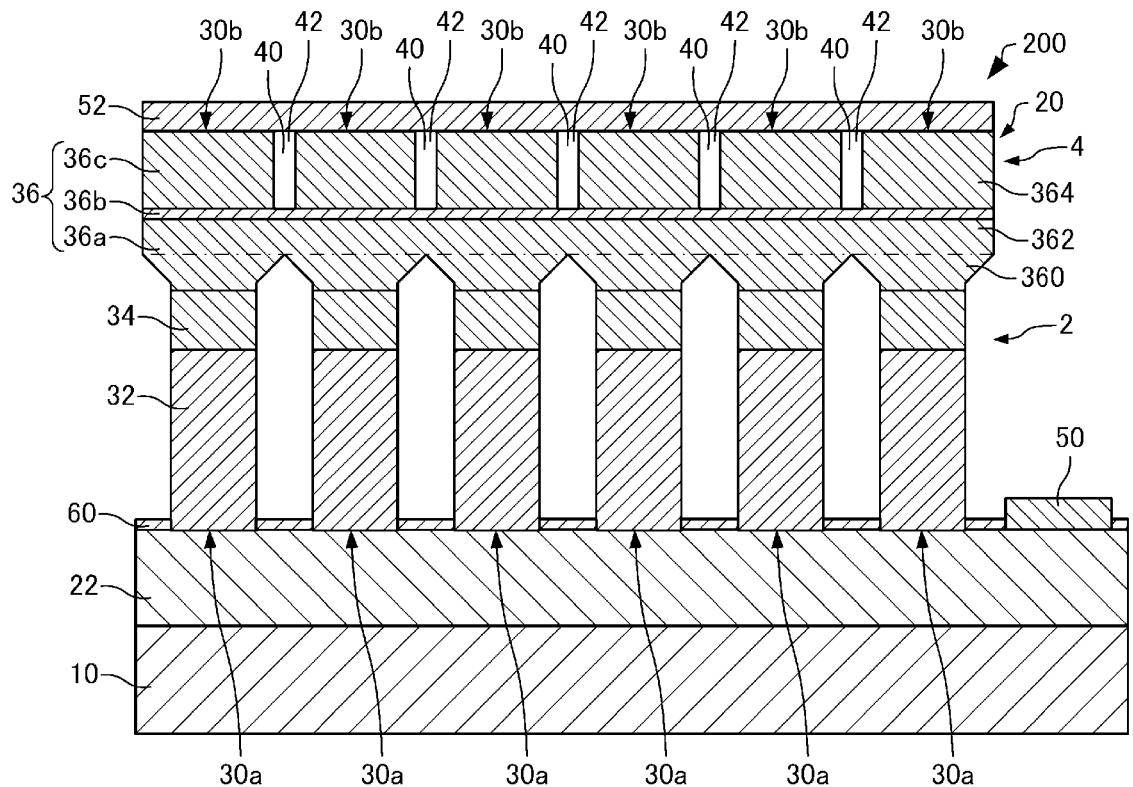
FIG. 7 is a cross-sectional view schematically showing a light emitting device according to a second embodiment.
Figure 8:
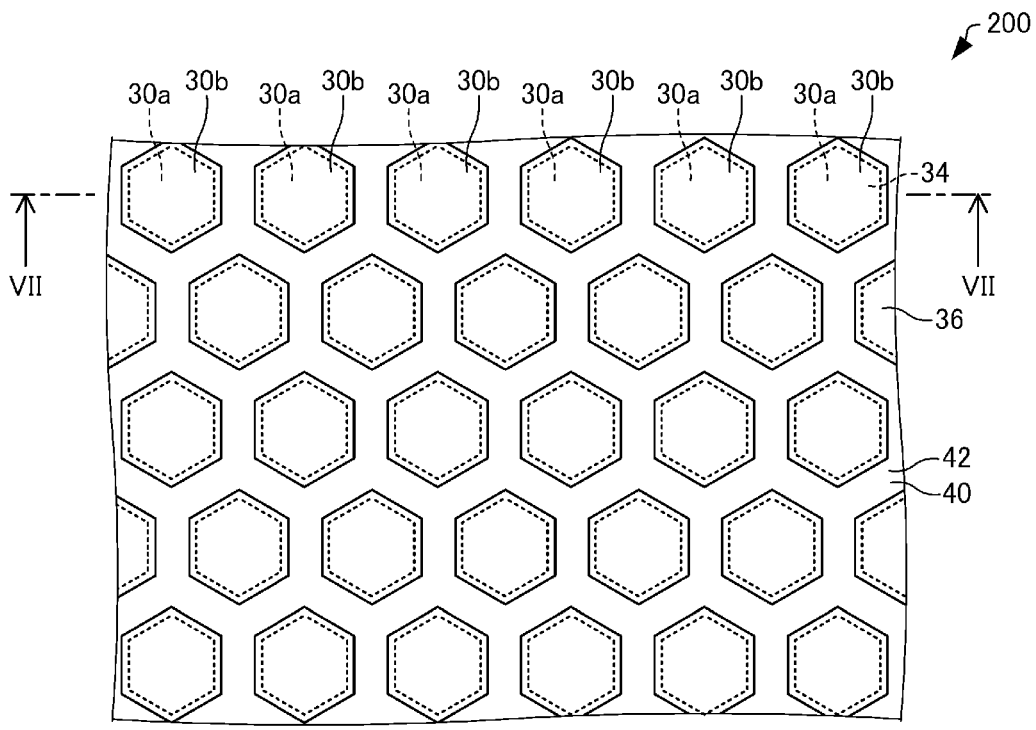
FIG. 8 is a plan view schematically showing the light emitting device according to the second embodiment.

Then, a light emitting device according to a second embodiment will be described with reference to the drawings. FIG. 7 is a cross-sectional view schematically showing the light emitting device 200 according to the second embodiment. FIG. 8 is a plan view schematically showing the light emitting device 200 according to the second embodiment. It should be noted that in FIG. 8, the second semiconductor layer 36 and the columnar parts 30 are illustrated for the sake of convenience. Further, FIG. 7 is a cross-sectional view along the line VII-VII shown in FIG. 8. Hereinafter, in the light emitting device 200 according to the second embodiment, the members having substantially the same functions as those of the constituent members of the light emitting device 100 according to the first embodiment described above will be denoted by the same reference symbols, and the detailed descriptions thereof will be omitted.

As shown in FIG. 2, in the light emitting device 100, by disposing the recessed parts 40 provided to the second semiconductor layer 36 so as to have the lattice arrangement of the same type as that of the columnar parts 30, have the same period as that of the columnar parts 30, and coincide in in-plane arrangement orientation with the columnar parts 30, the second photonic crystal 4 is formed.

In contrast, as shown in FIG. 7 and FIG. 8, in the light emitting device 200, by disposing second columnar parts 30b constituted by the second semiconductor layer 36 so as to have the lattice arrangement of the same type as that of the columnar parts 30 (hereinafter referred to as "first columnar parts 30a"), have the same period as that of the first columnar parts 30a, and coincide in in-plane arrangement orientation with the first columnar parts 30a, the second photonic crystal 4 is formed.

In the example shown in FIG. 8, the first columnar parts 30a and the second columnar parts 30b are arranged in the triangular lattice. In the plan view, the first columnar parts 30a and the second columnar parts 30b respectively overlap each other. Therefore, it is possible to efficiently inject the electrical current from the second electrode 52 into the light emitting layer 34. In the example shown in FIG. 8, the center of each of the first columnar parts 30a and the center of corresponding one of the second columnar parts 30b overlap.

The diametrical size of the second columnar part 30b is larger than the diametrical size of the light emitting layer 34 constituting the first columnar part 30a. Therefore, it is possible to efficiently inject the electrical current from the second electrode 52 into the light emitting layer 34. The planar shape of the second columnar part 30b is the same as, for example, the planar shape of the first columnar part 30a.

The second columnar parts 30b are each a portion having a columnar shape formed by disposing the recessed part 40 in the second semiconductor layer 36. A side surface of the second columnar part 30b is formed of an inner surface of the recessed part 40. In the recessed part 40, there is disposed the low refractive-index part 42. The low refractive-index part 42 is, for example, an air gap.

In the light emitting device 200, it is possible to optically couple the first photonic crystal 2 and the second photonic crystal 4 to each other to obtain the intense optical confinement effect similarly to the light emitting device 100. Therefore, in the light emitting device 200, it is possible to improve the optical confinement factor.

2.2. Method of Manufacturing Light Emitting Device

A method of manufacturing the light emitting device 200 is substantially the same as the method of manufacturing the light emitting device 100 except the point that the second columnar parts 30b are formed in the step of forming the recessed parts 40 in the second semiconductor layer 36, and therefore, the description thereof will be omitted.

2.3. Modified Example

Figure 9:
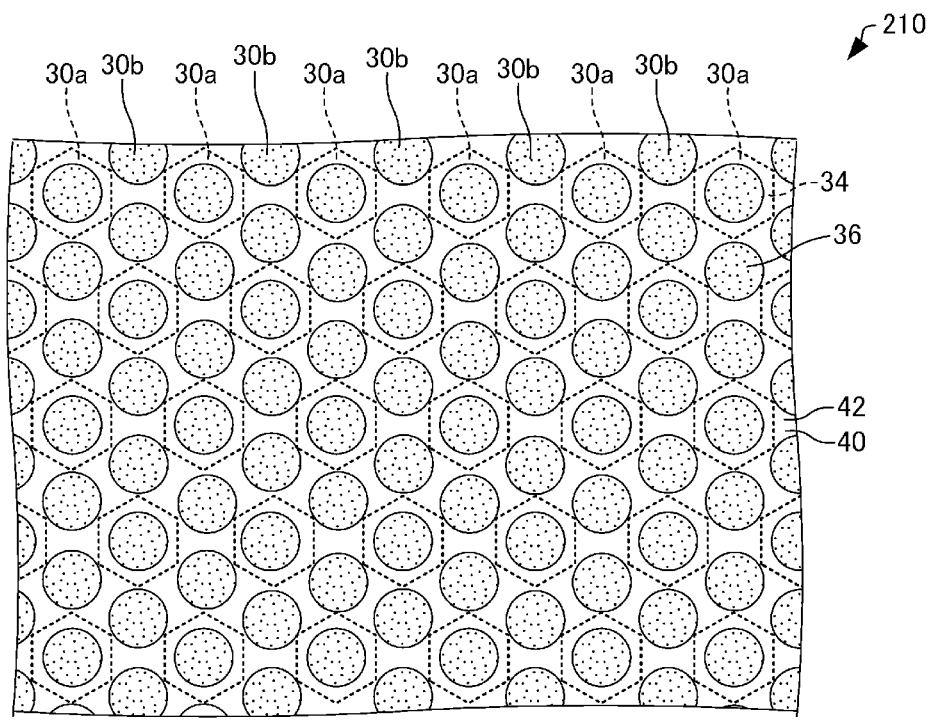
FIG. 9 is a plan view schematically showing a light emitting device according to a modified example of the second embodiment.

Then, a light emitting device according to a modified example of the second embodiment will be descried with reference to the drawing. FIG. 9 is a plan view schematically showing the light emitting device 210 according to the modified example of the second embodiment. Hereinafter, in the light emitting device 210 according to the modified example of the second embodiment, the members having substantially the same functions as those of the constituent members of the light emitting device 200 according to the second embodiment described above will be denoted by the same reference symbols, and detailed descriptions thereof will be omitted.

In the light emitting device 200 described above, the first photonic crystal 2 and the second photonic crystal 4 are arranged in the lattice arrangement of the same type, and the plurality of first columnar parts 30a and the plurality of second columnar parts 30b are both arranged in the triangular lattice.

In contrast, in the light emitting device 210, the first photonic crystal 2 and the second photonic crystal 4 are arranged in the lattice arrangement of the same type, but the lattice arrangement of the plurality of first columnar parts 30a and the lattice arrangement of the plurality of second columnar parts 30b are different from each other as shown in FIG. 9.

In the example shown in FIG. 9, the plurality of first columnar parts 30a is arranged in the triangular lattice. Further, the planar shape of the first columnar part 30a is a regular hexagon. The six second columnar parts 30b are disposed with respect to each of the first columnar parts 30a so as to correspond to the respective vertexes of the regular hexagon formed by the first columnar part 30a. Further, one of the second columnar parts 30b is disposed at the center of the first columnar parts 30a. By disposing the plurality of second columnar parts 30b in such a manner as described above, it is possible to make the first photonic crystal 2 and the second photonic crystal 4 have the lattice arrangement of the same type.

It should be noted that the arrangement of the first columnar parts 30a and the second columnar parts 30b is not limited to the example described above providing the first photonic crystal 2 and the second photonic crystal 4 have the lattice arrangement of the same type, and have the same period, and coincide in in-plane arrangement orientation with each other.

In the light emitting device 210, it is possible to optically couple the first photonic crystal 2 and the second photonic crystal 4 to each other to obtain the intense optical confinement effect similarly to the light emitting device 200. Therefore, in the light emitting device 210, it is possible to improve the optical confinement factor.

3. Third Embodiment

Figure 10:
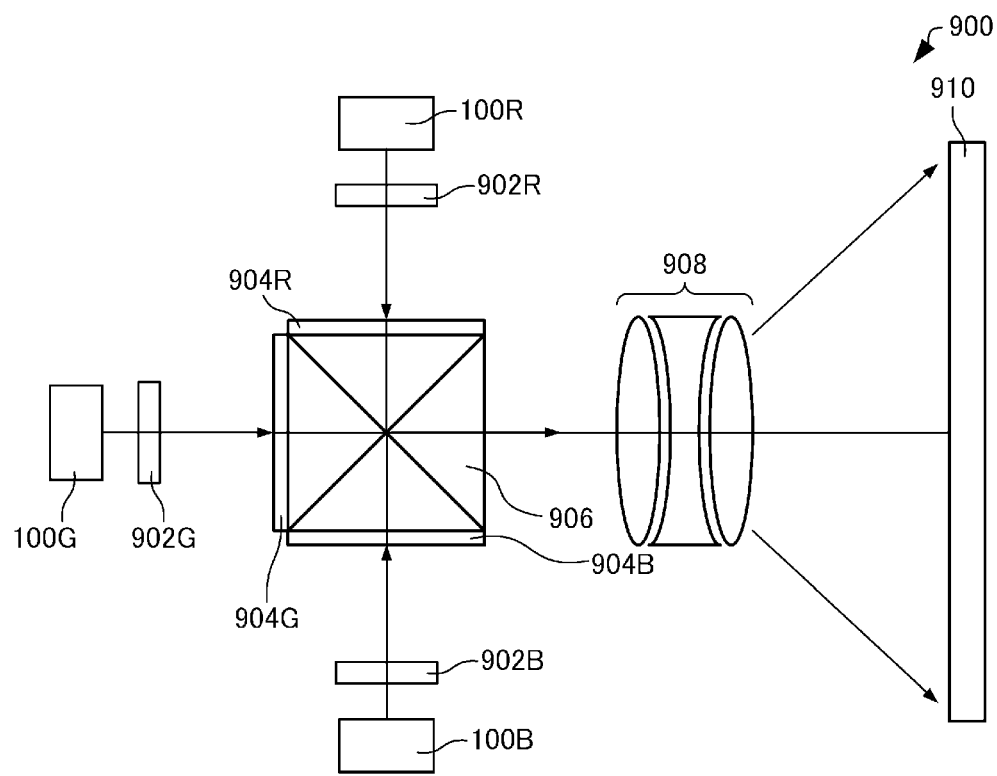
FIG. 10 is a diagram schematically showing a projector according to a third embodiment.

Then, a projector according to a third embodiment will be described with reference to the drawing. FIG. 10 is a diagram schematically showing the projector 900 according to the third embodiment.

The projector 900 has, for example, the light emitting device 100 as a light source.

The projector 900 includes a housing not shown, a red light source 100R, a green light source 100G, and a blue light source 100B which are disposed inside the housing, and respectively emit red light, green light, and blue light. It should be noted that in FIG. 10, the red light source 100R, the green light source 100G, and the blue light source 100B are simplified for the sake of convenience.

The projector 900 further includes a first optical element 902R, a second optical element 902G, a third optical element 902B, a first light modulation device 904R, a second light modulation device 904G, a third light modulation device 904B, and a projection device 908 all installed inside the housing. The first light modulation device 904R, the second light modulation device 904G, and the third light modulation device 904B are each, for example, a transmissive liquid crystal light valve. The projection device 908 is, for example, a projection lens.

The light emitted from the red light source 100R enters the first optical element 902R. The light emitted from the red light source 100R is collected by the first optical element 902R. It should be noted that the first optical element 902R can be provided with other functions than the light collection. The same applies to the second optical element 902G and the third optical element 902B described later.

The light collected by the first optical element 902R enters the first light modulation device 904R. The first light modulation device 904R modulates the incident light in accordance with image information. Then, the projection device 908 projects an image formed by the first light modulation device 904R on a screen 910 in an enlarged manner.

The light emitted from the green light source 100G enters the second optical element 902G. The light emitted from the green light source 100G is collected by the second optical element 902G.

The light collected by the second optical element 902G enters the second light modulation device 904G. The second light modulation device 904G modulates the incident light in accordance with the image information. Then, the projection device 908 projects an image formed by the second light modulation device 904G on the screen 910 in an enlarged manner.

The light emitted from the blue light source 100B enters the third optical element 902B. The light emitted from the blue light source 100B is collected by the third optical element 902B.

The light collected by the third optical element 902B enters the third light modulation device 904B. The third light modulation device 904B modulates the incident light in accordance with the image information. Then, the projection device 908 projects an image formed by the third light modulation device 904B on the screen 910 in an enlarged manner.

Further, it is possible for the projector 900 to include a cross dichroic prism 906 for combining the light emitted from the first light modulation device 904R, the light emitted from the second light modulation device 904G, and the light emitted from the third light modulation device 904B with each other to guide the light thus combined to the projection device 908.

The three colors of light respectively modulated by the first light modulation device 904R, the second light modulation device 904G, and the third light modulation device 904B enter the cross dichroic prism 906. The cross dichroic prism 906 is formed by bonding four rectangular prisms to each other, and is provided with a dielectric multilayer film for reflecting the red light and a dielectric multilayer film for reflecting the blue light disposed on the inside surfaces. The three colors of light are combined with each other by these dielectric multilayer films, and thus, the light representing a color image is formed. Then, the light thus combined is projected on the screen 910 by the projection device 908, and thus, an enlarged image is displayed.

It should be noted that it is possible for the red light source 100R, the green light source 100G, and the blue light source 100B to directly form the images by controlling the light emitting devices 100 as the pixels of the image in accordance with the image information without using the first light modulation device 904R, the second light modulation device 904G, and the third light modulation device 904B. Then, it is also possible for the projection device 908 to project the images formed by the red light source 100R, the green light source 100G, and the blue light source 100B on the screen 910 in an enlarged manner.

Further, although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and Digital Micromirror Device™. Further, the configuration of the projection device is appropriately modified in accordance with the type of the light valves used.

Further, it is also possible to apply the light source to a light source device of a scanning type image display device having a scanning unit as an image forming device for scanning the surface of the screen with the light from the light source to thereby display an image with a desired size on the display surface.

The light emitting devices according to the embodiment described above can also be used for other devices than projectors. As the applications other than projectors, there can be cited, for example, a light source of indoor and outdoor illumination, a backlight for a display, a laser printer, a scanner, an in-car light, sensing equipment using light, communication equipment, and so on.

In the present disclosure, some of the constituents can be omitted, or the embodiments and the modified example can be combined with each other within a range in which the features and the advantages described in the specification are provided.

The present disclosure is not limited to the embodiments described above, but can further variously be modified. For example, the present disclosure includes substantially the same configuration as the configurations described in the embodiments. Substantially the same configuration means a configuration substantially the same in, for example, function, way, and result, or a configuration substantially the same in object and advantage. Further, the present disclosure includes configurations obtained by replacing a non-essential part of the configuration explained in the above description of the embodiments. Further, the present disclosure includes configurations providing the same functions and the same advantages, or configurations capable of achieving the same object as those of the configuration explained in the description of the embodiments. Further, the present disclosure includes configurations obtained by adding a known technology to the configuration explained in the description of the embodiments.

What is claimed is:

1. A light emitting device comprising:
a substrate; and
a stacked body provided to the substrate, and including a plurality of first columnar parts, wherein
the stacked body includes
a first semiconductor layer,
a second semiconductor layer different in conductivity type from the first semiconductor layer, and
a light emitting layer disposed between the first semiconductor layer and the second semiconductor layer,
the first semiconductor layer and the light emitting layer constitute the first columnar parts,
the first semiconductor layer is disposed between the substrate and the light emitting layer,
the second semiconductor layer is provided with a plurality of recessed parts,
the recessed part is provided with a low refractive-index part lower in refractive index than the second semiconductor layer,
the plurality of the first columnar parts constitutes a first photonic crystal,
the second semiconductor layer and the low refractive-index parts constitute a second photonic crystal, and
the first photonic crystal and the second photonic crystal are optically coupled to each other,
wherein the second semiconductor layer has a portion disposed so as to straddle the plurality of the first columnar parts.

2. The light emitting device according to claim 1, wherein the optical distance between the first photonic crystal and the second photonic crystal is no more than $3\lambda$ ($\lambda$ is an lasing wavelength).

3. The light emitting device according to claim 1, wherein the first columnar parts and the low refractive-index parts overlap in a plan view.

4. The light emitting device according to claim 3, wherein the first columnar parts and the low refractive-index parts correspond one-to-one to each other.

5. The light emitting device according to claim 3, wherein a diametrical size of the recessed part is smaller than a diametrical size of the first columnar part.

6. The light emitting device according to claim 1, wherein the second semiconductor layer constitutes a plurality of second columnar parts, and
the first columnar parts and the second columnar parts overlap in a plan view.

7. A projector comprising:
the light emitting device according to claim 1.

* * * * *